(12) United States Patent
Stempfl et al.

(10) Patent No.: US 9,438,174 B2
(45) Date of Patent: Sep. 6, 2016

(54) QUASI-BROADBAND AMPLIFIER ACCORDING TO THE DOHERTY PRINCIPLE

(71) Applicant: Rohde & Schwarz GmbH & Co. KG, Munich (DE)

(72) Inventors: Sebastian Stempfl, Munich (DE); Bernhard Kaehs, Unterhaching (DE); Uwe Dalisda, Fuerstenfeldbruck (DE); Lothar Schenk, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/410,069

(22) PCT Filed: Apr. 23, 2013

(86) PCT No.: PCT/EP2013/058359
§ 371 (c)(1),
(2) Date: Dec. 20, 2014

(87) PCT Pub. No.: WO2014/000905
PCT Pub. Date: Jan. 3, 2014

(65) Prior Publication Data
US 2015/0318828 A1    Nov. 5, 2015

(30) Foreign Application Priority Data
Jun. 29, 2012  (DE) .............. 10 2012 211 308

(51) Int. Cl.
*H03F 3/68*  (2006.01)
*H03F 1/02*  (2006.01)
(Continued)

(52) U.S. Cl.
CPC ............. *H03F 1/0288* (2013.01); *H03F 3/19* (2013.01); *H03F 3/217* (2013.01); *H03F 2200/198* (2013.01); *H03F 2200/204* (2013.01);
(Continued)

(58) Field of Classification Search
CPC ...... H03F 3/60; H03F 3/68; H03F 2200/391; H03F 2200/417
USPC ......................... 330/53, 54, 124 R, 286, 295
See application file for complete search history.

(56) References Cited

U.S. PATENT DOCUMENTS 7,486,136 B2   2/2009  Bakalski et al.
7,570,932 B1*  8/2009  Folkmann ............. H03F 1/0277
                                                       330/295

(Continued)

FOREIGN PATENT DOCUMENTS

DE  102007046047 A1   4/2008
EP       1609239 B1   7/2010
WO   WO2012150126 A1  11/2012

OTHER PUBLICATIONS

Nishino, et al., "Tunable MEMS Hybrid COupler and L-Band Tunable Filter", IEEE 978-1-4244-2804-5/09, 2009.

(Continued)

*Primary Examiner* — Steven J Mottola
(74) *Attorney, Agent, or Firm* — Potomac Technology Law, LLC

(57) ABSTRACT

An amplifier comprises a first amplifier circuit, a second amplifier circuit, a hybrid-coupler circuit and a termination. The hybrid-coupler circuit comprises an output port and an isolation port. The termination in this context is connected to the isolation port of the hybrid-coupler circuit. The termination comprises a first switch, a first capacitor and a first inductance.

13 Claims, 3 Drawing Sheets

(51) Int. Cl.
*H03F 3/217* (2006.01)
*H03F 3/19* (2006.01)

(52) U.S. Cl.
CPC ..... *H03F2200/36* (2013.01); *H03F 2200/391* (2013.01); *H03F 2200/417* (2013.01); *H03F 2200/451* (2013.01)

(56) References Cited

U.S. PATENT DOCUMENTS 7,773,959 B1 8/2010 Bachhuber et al.
2004/0189380 A1 9/2004 Myer et al.
2007/0008032 A1 1/2007 Kyu et al.
2011/0279178 A1 11/2011 Outaleb et al.
2014/0062589 A1 3/2014 Schenk

OTHER PUBLICATIONS

"International Preliminary Report on Patentability", PCT/EP2013/058359, Jan. 8, 2015.

* cited by examiner

QUASI-BROADBAND AMPLIFIER ACCORDING TO THE DOHERTY PRINCIPLE

FIELD OF THE INVENTION

The invention relates to an amplifier, and more particularly a Doherty amplifier.

BACKGROUND

Doherty amplifiers are used conventionally to construct high-frequency amplifiers with high efficiency and high linearity.

From European Patent EP 1 609 239 B1, a Doherty amplifier is known which uses a 3 dB coupler simultaneously as impedance transformer for the main amplifier and as power combiner for the main and auxiliary amplifier by terminating the decoupled terminal of the 3 dB coupler, normally terminated with the system wave impedance, with a short-circuit or open-circuit line of given length. The arrangement shown in that context has the disadvantage that a frequency change beyond the conventional Doherty bandwidth is not possible, and the space requirement for a low-loss line is relatively large.

What is needed, therefore, is a high-frequency amplifier which, with a high efficiency and high linearity, demands a small space requirement and simultaneously allows a high flexibility in circuit construction.

SOME EXAMPLE EMBODIMENTS

Embodiments of the present invention advantageously address the foregoing requirements and needs, as well as others, by providing a high-frequency amplifier which, with a high efficiency and high linearity, demands a small space requirement and simultaneously allows a high flexibility in circuit construction.

In accordance with a first example embodiment, an amplifier comprises a first amplifier circuit, a second amplifier circuit, a hybrid-coupler circuit and a termination. The hybrid-coupler circuit comprises an output port and an isolation port. In this context, the termination is connected to the isolation port of the hybrid-coupler circuit. The termination comprises a first switch, a first capacitor and a first inductance. Accordingly, an adjustability of the frequency response of the termination is achieved.

By way of example, the first switch may selectively connect the first capacitor to the first inductance. Accordingly, the adjustability of the frequency response of the termination is further improved.

By way of further example, the termination contains a second capacitor or a second inductance. Further, where the termination provides at least two capacitors, the first switch may selectively connect in each case one of the capacitors to the first inductance. Further, where the termination provides at least two inductances, the first switch may selectively connect in each case one of the inductances to the first capacitor. In this manner, a further improvement of the adjustability of the frequency response of the termination is achieved.

By way of further example, the termination provides a second switch and a third capacitor or a third inductance, directly connected to the isolation port. The second switch then connects the isolation port selectively to the first inductance or to the first capacitor. The adjustability of the frequency response of the termination is also improved through this measure.

By way of further example, the termination provides the second capacitor, the second switch and the third capacitor. The third capacitor and the second switch are then directly connected to the isolation port. The first inductance is then connected to a terminal of the second switch remote from the isolation port. In this case, the first switch is connected to a terminal of the first inductance remote from the second switch. The first capacitor and the second capacitor are then connected to a terminal of the first switch remote from the first inductance. An improved frequency response can be achieved in this manner.

By way of further example, the termination provides the second inductance, the second switch and the third inductance. The third inductance and the second switch are then connected directly to the isolation port. The first capacitor in this case is connected to a terminal of the second switch remote from the isolation port. The first switch is then connected to a terminal of the first capacitor remote from the second switch. The first inductance and the second inductance in this case are connected to a terminal of the first switch remote from the first capacitor. With this alternative, an improved frequency response can also be achieved.

In accordance with a second example embodiment, an alternative amplifier comprises a first amplifier circuit, a second amplifier circuit, a hybrid-coupler circuit and a termination. The hybrid-coupler circuit comprises an output port and an isolation port. The termination is connected to the isolation port of the hybrid-coupler circuit. The termination comprises a first ohmic resistor and a first capacitor and/or a first inductance. The first ohmic resistor and the first capacitor respectively the first inductance are connected in series. Accordingly, an additional attenuation of the termination can be adjusted.

By way of example, the termination provides the first inductance, a second inductance, the first capacitor and a second ohmic resistor. The first capacitor and the first inductance are then connected to the isolation port. The second inductance is then connected to a terminal of the first capacitor remote from the isolation port. The first ohmic resistor is then connected in series to the first inductance. The second ohmic resistor in this case is connected in series to the second inductance. Accordingly, an attenuation of the termination can be accurately adjusted.

By way of further example, the termination contains the first inductance, a second inductance, the first capacitor, a second ohmic resistor and a third ohmic resistor. The first capacitor and the first inductance are then connected to the third ohmic resistor, which is connected to the isolation port. The second inductance is then connected to a terminal of the first capacitor remote from the isolation port. The first ohmic resistor in this case is connected in series to the first inductance. The second ohmic resistor in this case is connected in series to the second inductance. The third ohmic resistor is then connected in series to the first capacitor. With this construction also, the attenuation can be accurately adjusted.

By way of further example, the termination provides the first inductance, the first capacitor, a second capacitor and a second ohmic resistor. The first capacitor and the first inductance are then connected to the isolation port. The second capacitor is then connected to a terminal of the first inductance remote from the isolation port. In this case, the first ohmic resistor is connected in series to the first capacitor, while the second ohmic resistor is connected in series to the second capacitor. With this construction also, the attenuation can be accurately adjusted.

In accordance with a third example embodiment, an amplifier comprises a first amplifier circuit, a second amplifier circuit, a hybrid-coupler circuit and a termination. The hybrid-coupler circuit comprises an output port and an isolation port. The termination is connected to the isolation port of the hybrid-coupler circuit. In this context, the termination provides a second hybrid-coupler circuit. Accordingly, the frequency response of the termination can be adjusted by means of the hybrid-coupler circuit.

By way of further example, the second hybrid-coupler circuit is terminated at an isolation port with a first capacitor, by particular preference with a capacitor with adjustable capacitance. The second hybrid-coupler circuit is terminated at an output port with a capacitor, by particular preference with a capacitor with adjustable capacitance. In this manner, the frequency response of the termination can be accurately adjusted.

By way of further example, the second hybrid-coupler circuit is terminated at an input terminal, for example, with a capacitor or with a capacitor with adjustable capacitance. A further improvement of the adjustability of the frequency response is obtained in this manner.

By way of further example, the second hybrid-coupler circuit is embodied to act as an adjustable phase shifter. Accordingly, the frequency response can be accurately adjusted.

BRIEF DESCRIPTION OF THE DRAWINGS

The present invention is illustrated by way of example, and not by way of limitation, on the basis of the drawings in which advantageous example embodiments of the invention are presented, as follows.

DETAILED DESCRIPTION OF EXAMPLE EMBODIMENTS

Figure 1:
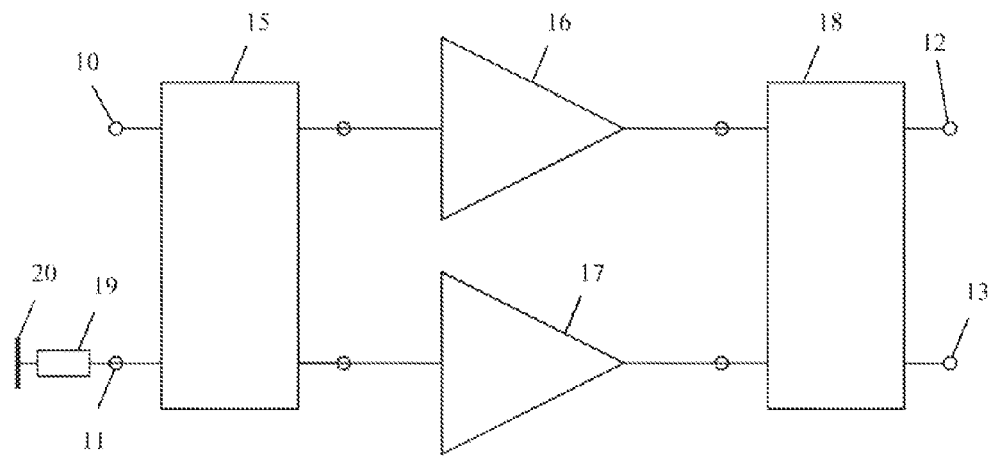
FIG. 1 illustrates an example Doherty amplifier without circuit configuration of the isolation port and the output port.

Initially, with reference to FIG. 1, the construction and the general function of a Doherty amplifier is explained. Following this, in FIGS. 2-10, the termination of the amplifier of FIG. 1, according to various example embodiments of the present invention, are presented with regard to their construction and their function. In similar images, the presentation and description of identical elements has, in some cases, not been repeated.

FIG. 1 shows an exemplary Doherty amplifier. A power splitter 15 comprises two input terminals 10 and 11. An input signal can be fed to the first input terminal 10. The second input terminal 11 is terminated with a resistor 19 and a ground terminal 20. Furthermore, a first amplifier circuit 16 and a second amplifier circuit 17 are connected to the power splitter 15. These form the main amplifier and the auxiliary amplifier according to the Doherty principle. Outputs of these amplifier circuits 16, 17 are connected to a hybrid-coupler circuit 18. The hybrid-coupler circuit in this context comprises an isolation port 12 and an output port 13. Both connections are shown here without circuit configuration. In an application, the resulting, amplified signal is output at the output port. In this context, the isolation port 12 is terminated. With reference to FIGS. 2-10, various circuits for the termination of this connection are shown by way of example.

The signal to be amplified is supplied to the input port 10 of the power splitter 15. This splits the signal between the two amplifier circuits 16, 17 which amplify the signal according to the Doherty principle. The amplified signals are combined by the hybrid-coupler circuit 18 at its output port 13. Through a circuit configuration of the isolation port 12 of the hybrid-coupler circuit 18, an optimal termination of the hybrid-coupler circuit 18 with a given frequency is achieved.

Figure 2:
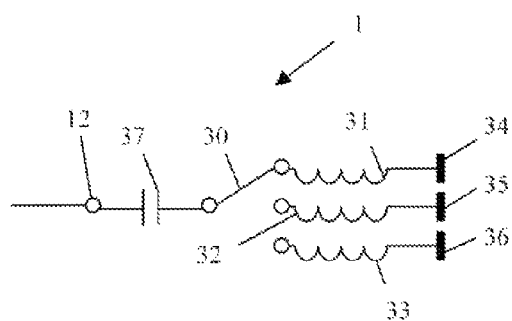
FIG. 2 illustrates the termination of the amplifier of FIG. 1 according to a first example embodiment of the present invention.

FIG. 2 shows a first termination of the amplifier circuit according to an example embodiment of the invention in a detail view. The view shown here corresponds to the circuit configuration of the isolation port 12 from FIG. 1. The entire circuit connected to the isolation port 12 is designated as termination 1. A capacitor 37 is directly connected to the isolation port 12. Connected to this is a switch 30, which switches between an inductance 31, an inductance 32 and an inductance 33. Each of the inductances 31-33 in this context is connected to a ground terminal 34-36. The inductances 31-33 in this context provide different values. The circuit illustrated here allows an accurate adjustment of a frequency characteristic of the termination 1.

Figure 3:
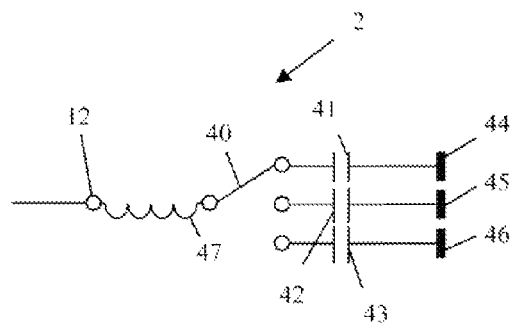
FIG. 3 illustrates the termination of the amplifier of FIG. 1 according to a second example embodiment of the present invention.

In FIG. 3, a further termination 2 of the isolation port 12 is shown, according to an example embodiment of the invention. An inductance 47, which is connected to a switch 40, is directly connected to the isolation port 12. In this context, the switch 40 is embodied to switch, in the exemplary embodiment, between three capacitors 41-43, which are each connected to a ground terminal 44-46. In this context, the capacitors 41-43 provide different capacitances. Accordingly, it is also possible here to adjust the frequency characteristic of the termination 2 accurately. Naturally, only two or more than three capacitors can also be present.

Figure 4:
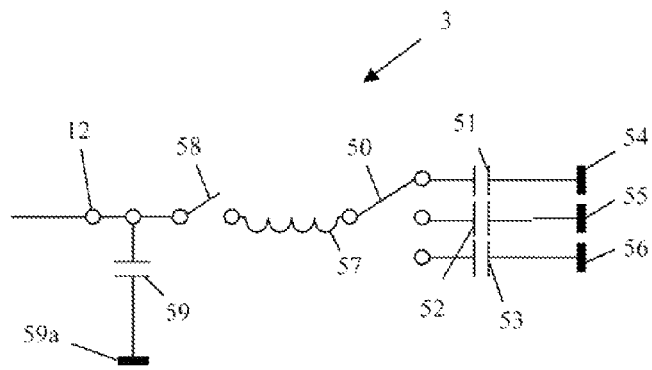
FIG. 4 illustrates the termination of the amplifier of FIG. 1 according to a third example embodiment of the present invention.

FIG. 4 shows a third termination of the amplifier circuit according to an example embodiment of the invention. Here also, a termination 3 for connection to the isolation port 12 is illustrated. A capacitor 59 which is connected to a ground terminal 59a is directly connected to the isolation port 12. Furthermore, a switch 58 which is connected to an inductance 57 is directly connected to the isolation port 12. The remote end of the inductance 57 is, in turn, connected to a switch 50 which switches, in the exemplary embodiment, between three capacitors 51-53. In this context, the capacitors 51-53 are each connected to a ground terminal 54-56 and provide different values. If the switch 58 is disposed in the open position, only the capacitor 59 is connected to the isolation port 12. However, if the switch 58 is closed, it is possible to switch between the capacitors 51 to 53 by means of the switch 50. In this manner, a very accurate adjustment of the frequency characteristic of the termination 3 is possible. In particular, with a switch 58, it is possible to separate a plurality of components from the circuit and thus to achieve a very high quality. Naturally, only two or more than three capacitors can also be present.

Instead of the switch 50, a switching matrix can be used here, which allows a simultaneous switching of several paths. Accordingly, with the use of the switching matrix, 0 to 3 of the capacitors 51-53 can be connected to the inductance 57. A use of a larger number of paths and therefore capacitors is also conceivable. With the use of the switching matrix, the individual capacitors no longer need to provide different values. Accordingly, one or more of the capacitors 51-53 can provide the same values.

The switching matrix described can, of course, also be used in an alternative exemplary embodiment, in which the inductance 57 is replaced by a capacitor and in which the capacitors 51-53 are replaced by inductances. A use of such a switching matrix instead of the conventional changeover switches 30 and 40 in the exemplary embodiments shown in FIG. 2 and FIG. 3 is also possible.

All of the switches of the previously described exemplary embodiments in this context can be realized as PIN diode switches. In this context, a PIN diode is used as a series element. The two terminals of the PIN diode are connected via inductances to control terminals. Direct-voltage control signals which control the respective PIN-diode switches are connected to the control terminals. The inductances prevent a drainage of the high-frequency signal via the control terminals. Alternatively, the switches can be realized as high-frequency relays or mechanical switches or as a solder bridges. Different, named switch types can also be combined within one circuit.

Figure 5:
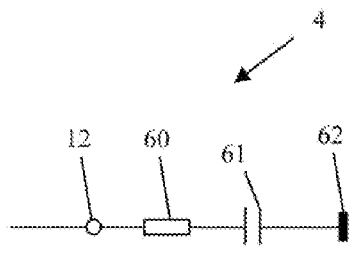
FIG. 5 illustrates the termination of the amplifier of FIG. 1 according to a fourth example embodiment of the present invention.

FIG. 5 shows a fourth termination of the amplifier circuit according to an example embodiment of the invention. Here also, only one termination 4 for the connection to the isolation port 12 from FIG. 1 is illustrated. Directly connected to the isolation port 12 is the ohmic resistor 60, which is connected in series to a capacitor 61, which, in turn, is connected to a ground terminal 62. An attenuation in the termination 4 can be additionally generated by means of the ohmic resistor. Accordingly, a capacitive behavior is possible with simultaneous attenuation.

Figure 6:
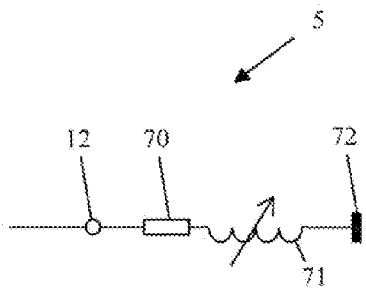
FIG. 6 illustrates the termination of the amplifier of FIG. 1 according to a fifth example embodiment of the present invention.

FIG. 6 shows a fifth termination of the amplifier circuit according to an example embodiment of the invention. Here also, only one termination 5 to be connected to the isolation port 12 from FIG. 1 is shown. Directly connected to the isolation port 12 is an ohmic resistor 70 which is connected to an adjustable inductance 71. Here, a fixed inductance 71 can also be used as an alternative. At its remote end, the inductance 71 is connected, in turn, to a ground terminal. In this manner, an inductive behavior can be achieved here with simultaneous attenuation.

Figure 7:
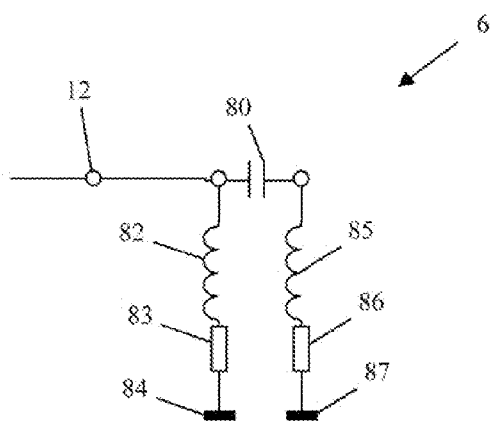
FIG. 7 illustrates the termination of the amplifier of FIG. 1 according to a sixth example embodiment of the present invention.

Furthermore, in order to achieve an even better adjustability of the frequency response, filters of relatively higher order can be used as the termination. Accordingly, FIG. 7 shows a sixth termination of the amplifier circuit according to an example embodiment of the invention with such a filter. Here also, in turn, only one termination 6 to be connected to the isolation port 12 is illustrated. Directly connected to the isolation port 12 is a capacitor 80 as a series element. In an alternative embodiment, the terminal of the capacitor 80 remote from the isolation port 12 could be connected via a switch to an additional ground terminal. Inductances 82 and 85 are used as transverse elements. In this context, the inductance 82 is directly connected to the isolation port 12. At its remote end, it is connected to an ohmic resistor 83 which is connected in turn to a ground terminal 84. The inductance 85 is connected to the ground terminal of the capacitor 80. At its remote end, it is connected, in turn, via an ohmic resistor 86 to a ground terminal 87. With the PI element illustrated here, the frequency response can be adjusted very accurately. An attenuation is additionally realizable through the ohmic resistors.

Figure 8:
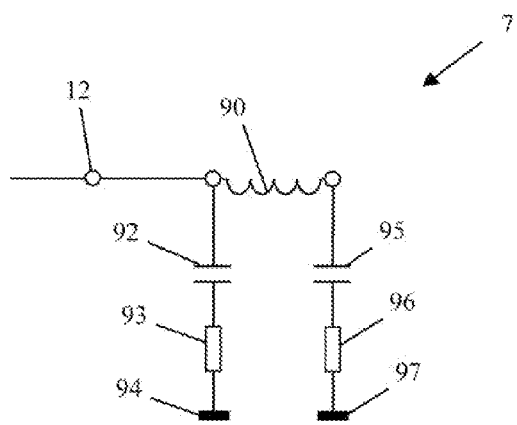
FIG. 8 illustrates the termination of the amplifier of FIG. 1 according to a seventh example embodiment of the present invention.

FIG. 8 shows a seventh termination of the amplifier circuit according to an example embodiment of the invention. Here, in turn, only one termination 7 to be connected to the isolation port 12 from FIG. 1 is illustrated. The illustration corresponds largely to the illustration from FIG. 7. In this context, an inductance 90 is used as series element. Here also, in an alternative embodiment, the terminal of the inductance 90 remote from the isolation port 12 could be connected via a switch to an additional ground terminal. Capacitors 92 and 95 which are connected via ohmic resistors 93 and 96 to ground terminals 94 and 97 are used as transverse elements. In this context, the capacitor 92 is connected to the isolation port 12. Accordingly, the capacitor 95 is connected to the ground terminal of the inductance 90.

Figure 9:
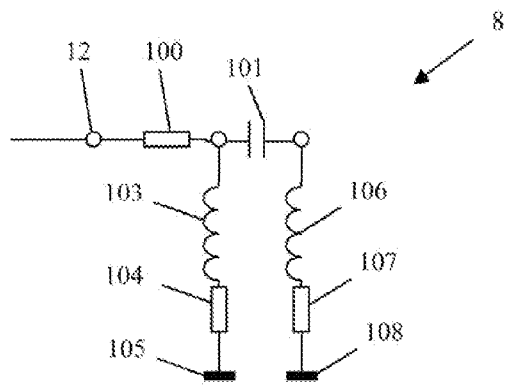
FIG. 9 illustrates the termination of the amplifier of FIG. 1 according to an eighth example embodiment of the present invention.

Furthermore, FIG. 9 illustrates an eighth termination of the amplifier circuit according to an example embodiment of the invention. Here also, only one termination 8 for the circuit configuration of the isolation port 12 from FIG. 1 is illustrated. The illustration shown here corresponds largely to the illustration from FIG. 7. Accordingly, a PI element made from a capacitor 101 and two inductances 103 and 106 is once again connected to the isolation port 12. However, the PI element is connected to the isolation port 12 via an ohmic resistor 100. Here also, the connection of a ground terminal via a switch to the terminal of the capacitor 101 remote from the isolation port is also conceivable. The ground terminals 105 and 108 correspond to the ground terminals 84 and 87 from FIG. 7. The ohmic resistors 104 and 107 correspond to the ohmic resistors 83 and 86 from FIG. 7. A further improved attenuation can be realized through the ohmic resistor 100.

Figure 10:
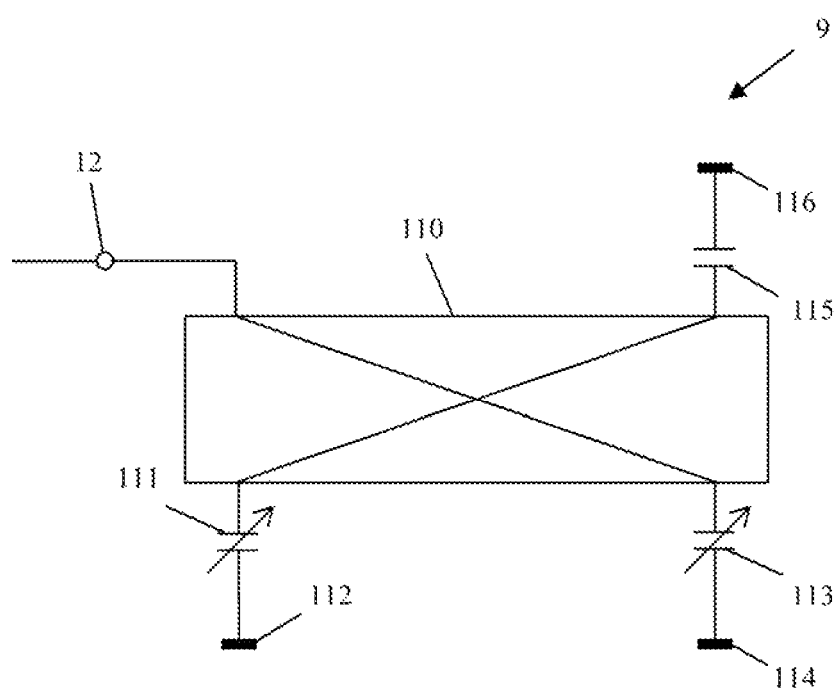
FIG. 10 illustrates the termination of the amplifier of FIG. 1 according to a ninth example embodiment of the present invention.

FIG. 10 shows a ninth termination of the amplifier circuit according to an example embodiment of the invention. Here also, only one termination 9 to be connected to the isolation port 12 from FIG. 1 is shown. In this context, the termination 9 contains a hybrid-coupler 110 which is connected with an input terminal to the isolation port 12. A further input terminal is connected via a capacitor 115 to a ground terminal 116. The output ports of the hybrid coupler 110 are connected via adjustable capacitors 111 and 113 to ground terminals 112 and 114. The accurate frequency response can be adjusted via the adjustable capacitors 111 and 113. The hybrid coupler is accordingly used here as a variable phase shifter.

The invention is not restricted to the illustrated exemplary embodiment. In this context, all of the fixed inductances, capacitors and ohmic resistors can be embodied individually as adjustable. A mechanical adjustability, in each case by means of an adjustment element, is also conceivable. Furthermore, it is also conceivable to replace all components shown as adjustable only with components of fixed values. This achieves a relatively simpler manufacture with reduced costs. All of the features described above or features shown in the Figures can be combined arbitrarily with one another in an advantageous manner within the scope of the invention.

The invention claimed is:

1. An amplifier comprising:
a first amplifier circuit, a second amplifier circuit, a hybrid-coupler circuit and a termination,
wherein the hybrid-coupler circuit includes an output port and an isolation port, and
wherein the termination is connected to the isolation port of the hybrid-coupler circuit, and
wherein the termination includes a first switch, and a first capacitor and a first inductance, and
wherein the first switch selectively connects the first capacitor to the first inductance.

2. The amplifier according to claim 1, wherein,
the termination includes either at least a second capacitor or at least a second inductance,
where the termination includes at least two capacitors, the first switch selectively connects one of the two capacitors to the first inductance, and
where the termination includes at least two inductances, the first switch selectively connects one of the two inductances to the first capacitor.

3. The amplifier according to claim 2, wherein the termination includes a second switch and one or more of a third capacitor and a third inductance directly connected to the isolation port, and wherein the second switch selectively connects the isolation port to the one or more of the first inductance and the first capacitor.

4. The amplifier according to claim 3, wherein,
the termination includes the second capacitor, the second switch and the third capacitor,
the third capacitor and the second switch are directly connected to the isolation port,
the first inductance is connected to a terminal of the second switch remote from the isolation port,
the first switch is connected to a terminal of the first inductance remote from the second switch, and
the first capacitor and the second capacitor are connected to a terminal of the first switch remote from the first inductance.

5. The amplifier according to claim 3, wherein,
the termination includes the second inductance, the second switch and the third inductance,
the third inductance and the second switch are directly connected to the isolation port,
the first capacitor is connected to a terminal of the second switch remote from the isolation port,
the first switch is connected to a terminal of the first capacitor remote from the second switch, and
the first inductance and the second inductance are connected to a terminal of the first switch remote from the first capacitor.

6. An amplifier comprising:
a first amplifier circuit, a second amplifier circuit, a hybrid-coupler circuit and a termination,
wherein the hybrid-coupler circuit includes an output port and an isolation port,
wherein the termination is connected to the isolation port of the hybrid-coupler circuit,
wherein the termination includes a first ohmic resistor, a second ohmic resistor, a first capacitor, a first inductance and a second inductance,
wherein the first capacitor and the first inductance are connected to the isolation port, and
wherein the second inductance is connected to a terminal of the first capacitor remote from the isolation port,
wherein the first ohmic resistor is connected in series to the first inductance, and the second ohmic resistor is connected in series to the second inductance.

7. The amplifier according to claim 6, wherein,
the termination includes the first inductance, a second inductance, the first capacitor, a second ohmic resistor and a third ohmic resistor,
the first capacitor and the first inductance are connected to the third ohmic resistor, which is connected to the isolation port,
the second inductance is connected to a terminal of the first capacitor remote from the isolation port,
the first ohmic resistor is connected in series to the first inductance,
the second ohmic resistor is connected in series to the second inductance, and
the third ohmic resistor is connected in series to the first capacitor.

8. The amplifier according to claim 6, wherein,
the termination includes the first inductance, the first capacitor, a second capacitor and a second ohmic resistor,
the first capacitor and the first inductance are connected to the isolation port,
the second capacitor is connected to a terminal of the first inductance remote from the isolation port,
the first ohmic resistor is connected in series to the first capacitor, and
the second ohmic resistor is connected in series to the second capacitor.

9. An amplifier comprising:
a first amplifier circuit, a second amplifier circuit, a first hybrid-coupler circuit and a termination,
wherein the first hybrid-coupler circuit includes an output port and an isolation port,
wherein the termination is connected to the isolation port of the first hybrid-coupler circuit,
wherein the termination includes a second hybrid-coupler circuit, and
wherein the second hybrid-coupler circuit is terminated at its isolation port with a first capacitor, and the second hybrid-coupler circuit is terminated at one output port with a second capacitor.

10. The amplifier according to claim 9, wherein the second hybrid-coupler circuit is terminated at an input terminal with a capacitor.

11. The amplifier according to claim 9, wherein the second hybrid-coupler circuit is configured to act as an adjustable phase shifter.

12. The amplifier according to claim 9, wherein one or more of the first capacitor and the second capacitor are adjustable.

13. The amplifier according to claim 10, wherein the capacitor is adjustable.

* * * * *